United States Patent [19]
Aral

[11] Patent Number: 6,022,483
[45] Date of Patent: Feb. 8, 2000

[54] SYSTEM AND METHOD FOR CONTROLLING PRESSURE

[75] Inventor: Gurcan Aral, Cupertino, Calif.

[73] Assignee: Intergrated Systems, Inc., Sunnyale, Calif.

[21] Appl. No.: 09/037,769

[22] Filed: Mar. 10, 1998

[51] Int. Cl.[7] ............................... B31D 3/00; C23F 1/02
[52] U.S. Cl. ............................. 216/59; 156/345
[58] Field of Search ...................... 118/663, 692; 156/345, 345 MT; 216/59; 438/706; 137/487.5, 14

[56] References Cited

U.S. PATENT DOCUMENTS

| | | | |
|---|---|---|---|
| 5,758,680 | 6/1998 | Kaveh et al. | 137/14 |
| 5,813,426 | 9/1998 | Tan et al. | 137/14 |
| 5,816,285 | 10/1998 | Ohmi et al. | 137/487.5 |

Primary Examiner—Bruce Breneman
Assistant Examiner—Tima McGuthry-Banks
Attorney, Agent, or Firm—Pennie & Edmonds LLP

[57] ABSTRACT

A system for controlling the pressure in a chamber with a computer controlled exhaust throttle valve. A characterization relationship describes the static properties of the valve geometry, valve actuation mechanism and gas flow properties. This characterization relationship can comprise a theoretical or empirical function which associates a sufficient number of valve positions with the corresponding pressure, and may be parameterized by other auxiliary variables such as inlet gas flow values, gas types and compositions. An inverse relationship between the current measurable variables of the process, such as pressure, inlet flows and other auxiliary parameters is defined. A linearization method uses the inverse relationship to modify the effect of the valve positioning on the corresponding value of pressure in such a way that the combined behavior of the process and the linearization method yields a linear relationship between a new control variable and the pressure. A linear feedback control method then controls the modified, linearized system.

20 Claims, 5 Drawing Sheets

SYSTEM AND METHOD FOR CONTROLLING PRESSURE

The present invention relates generally to control systems, and particularly to a system for controlling pressure in a chamber.

BACKGROUND OF THE INVENTION

Pressure control is an important component of a wide range of industrial processes. One type of process where pressure control is critical is semiconductor dry etch processes. Dry etch processes are used to etch patterns in semiconductor wafers. In a dry etch process, etch gases are fed into a chamber containing semiconductor wafers. The amount of the etch gases in the chamber must be carefully controlled to provide the desired etch characteristics. After the pressure in the chamber reaches a predetermined level, radio-frequency radiation ignites the etchant gases to create a plasma. The pressure in the chamber directly affects the etch process. A pressure above the desired level can cause the process to over etch the wafers. Conversely, a pressure below the desired level can cause the process to under etch the wafers. It is also important that the pressure be maintained at a constant level during the etch process. Pressure variations during the etch process can cause defective etching.

In one conventional approach to controlling pressure in a chamber, the chamber is equipped with a pressure sensor, a gas inflow controller, and a controllable throttle valve. The throttle valve separates the chamber from a vacuum pump. In a typical manual operation the inflow controller is set to a desired flow value, for example 100 sccm. The vacuum pump is then activated, and the throttle valve is adjusted until a desired pressure level, such as 10 mTorr is reached. In an automated approach, if the chamber pressure is higher than desired, an automatic controller gradually opens an exhaust valve to release gas from the chamber until the desired pressure is reached. This approach is unsuitable for many applications because it is generally limited to specific operating conditions outside of which its performance deteriorates rapidly. For example, changes in the desired pressure level, the gas flow level, or the type of gas to be used can render the performance of such systems unacceptable for high performance industrial systems such as semiconductor manufacturing systems. Furthermore, this process is slow and difficult to automate because the optimum valve position for a particular process recipe is dependent on a large number of factors.

An alternative approach to controlling pressure is to use a "calibration" based method. In calibration methods the performance of the equipment is characterized at each potential operating point over each of the operating parameter ranges. Such operating parameters may comprise the type of gas in the chamber, the rate of gas flow into the chamber, and the desired pressure. The valve position and the chamber pressure is recorded at each of these operating points. Generally the relationship between the valve position and the chamber pressure is a highly non-linear relationship. This non-linear relationship is a primary factor that renders linear controllers inadequate to efficiently control pressure.

The calibration process is used to determine the value of each of the operating parameters required to achieve the desired operating conditions. In a manufacturing process, the desired operating parameter values are retrieved for a given operating point and the valve is moved to the appropriate position to produce the desired chamber pressure. If all of the operating parameters are at the expected values then the pressure should reach the desired level based on the valve position setting. Minor errors between the actual and desired pressure can then be corrected using a slow automatic controller.

One problem with such calibration based approaches is that each time a process recipe is modified the operator must go through a lengthy and tedious calibration process. The calibration process wastes valuable production time. The calibration process also uses large numbers of wafers and large quantities of gases to evaluate the system at the desired operating points. Furthermore, such calibration based methods are highly vulnerable to failure when there are variations in the process conditions that are unknown to the operator.

FIG. 2 illustrates the pressure response over a range of different pressure setpoints of a conventional pressure control system using a proportional-integral controller. The FIG. 2 plot of pressure vs time illustrates the inconsistent behavior of a conventional proportional-integral controller system. In the FIG. 2 plot the pressure setpoint is changed at 20 second intervals. The system response at low pressures is slow. For example, the system requires over 20 seconds to adjust the pressure from 0.5 mTorr to 1 mTorr. At higher pressures the system response overshoots the new pressure setpoint and rings badly thereafter. In a semiconductor manufacturing process, this overshoot and ringing is manifest as variations in the pressure of the chamber containing the wafer under fabrication. During a wafer etch process such pressure variations cause undesirable variations in the etch process. Consequently to avoid defects, dry etch processes typically wait until the pressure stabilizes before igniting the gas to create a plasma. This delay decreases the throughput of the manufacturing equipment and thereby increases the cost of the manufactured devices.

Thus an improved method and apparatus for controlling pressure that overcomes these and other problems of the prior art would be highly desirable.

SUMMARY OF THE INVENTION

The present invention provides an automatic pressure control system which automatically adjusts a pressure control actuator to achieve a desired pressure inside a chamber. The pressure control system of the present invention achieves the desired pressure quickly, consistently and with minimal sensor information. Furthermore the present invention provides this high performance pressure control in spite of variations in system components, such as gas inlet flow levels, inlet gas types, and variations in the vacuum pump characteristics. The present invention provides a uniform response over a wide range of operating parameters with no change or deterioration in control performance. The present invention also provides a simple tuning capability to adjust the pressure control response to setpoint changes to a desired form. In addition, the present invention achieves this performance without knowledge of the gas flow out of the chamber.

In one embodiment, the present invention controls the pressure in a chamber with a computer controlled exhaust throttle valve. A characterization relationship describes the static properties of the valve geometry, valve actuation mechanism and gas flow properties. This characterization relationship can comprise a theoretical or empirical function which associates a sufficient number of valve positions with the corresponding pressure, and may be parameterized by other auxiliary variables such as inlet gas flow values, gas types and compositions. An inverse relationship between the current measurable variables of the process, such as pressure, inlet flows and other auxiliary parameters is defined. A linearization method uses the inverse relationship to modify the effect of the valve positioning on the corresponding value of pressure in such a way that the combined behavior of the process and the linearization method yields a linear relationship between a new control variable and the pressure. A linear feedback control method then controls the modified, linearized system.

BRIEF DESCRIPTION OF THE DRAWINGS

Additional objects and features of the invention will be more readily apparent from the following detailed description and appended claims when taken in conjunction with the drawings, in which:

FIG. 1 illustrates a vacuum chamber system in which the present invention can be implemented.

FIG. 2 illustrates the pressure response over a range of different pressure setpoints of a conventional pressure control system using a proportional-integral controller.

FIG. 3 illustrates a flow chart of a method for controlling pressure according to one embodiment of the present invention.

FIG. 4 illustrates a block of a pressure control system according to one embodiment of the present invention.

FIG. 5 illustrates the pressure response over a range of different pressure setpoints of a pressure control system according to one embodiment of the present invention.

DESCRIPTION OF THE PREFERRED EMBODIMENTS

Figure 1:
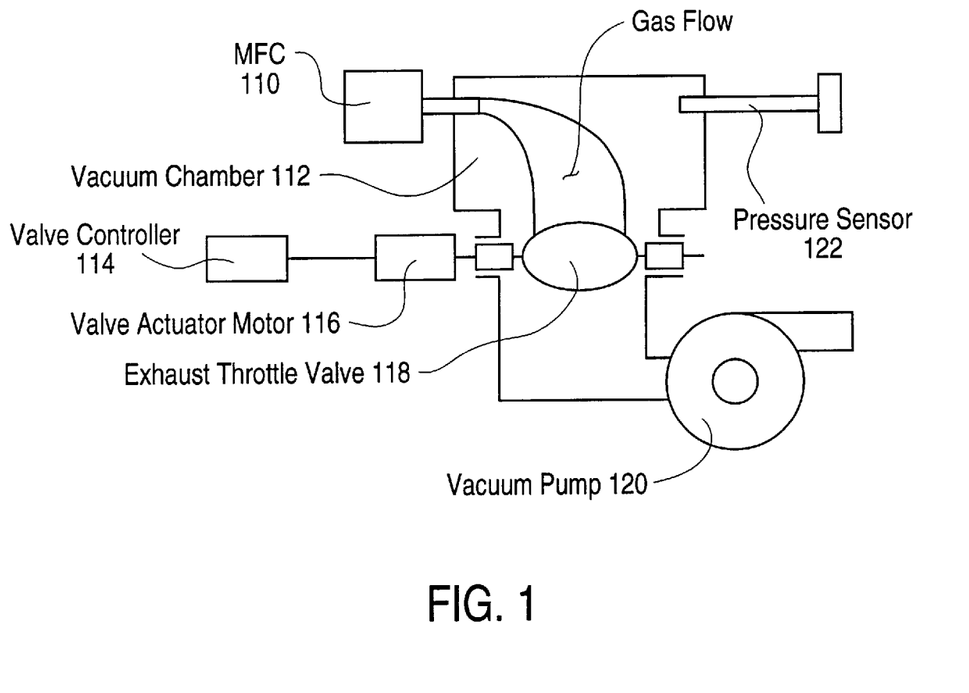
Figure 2:
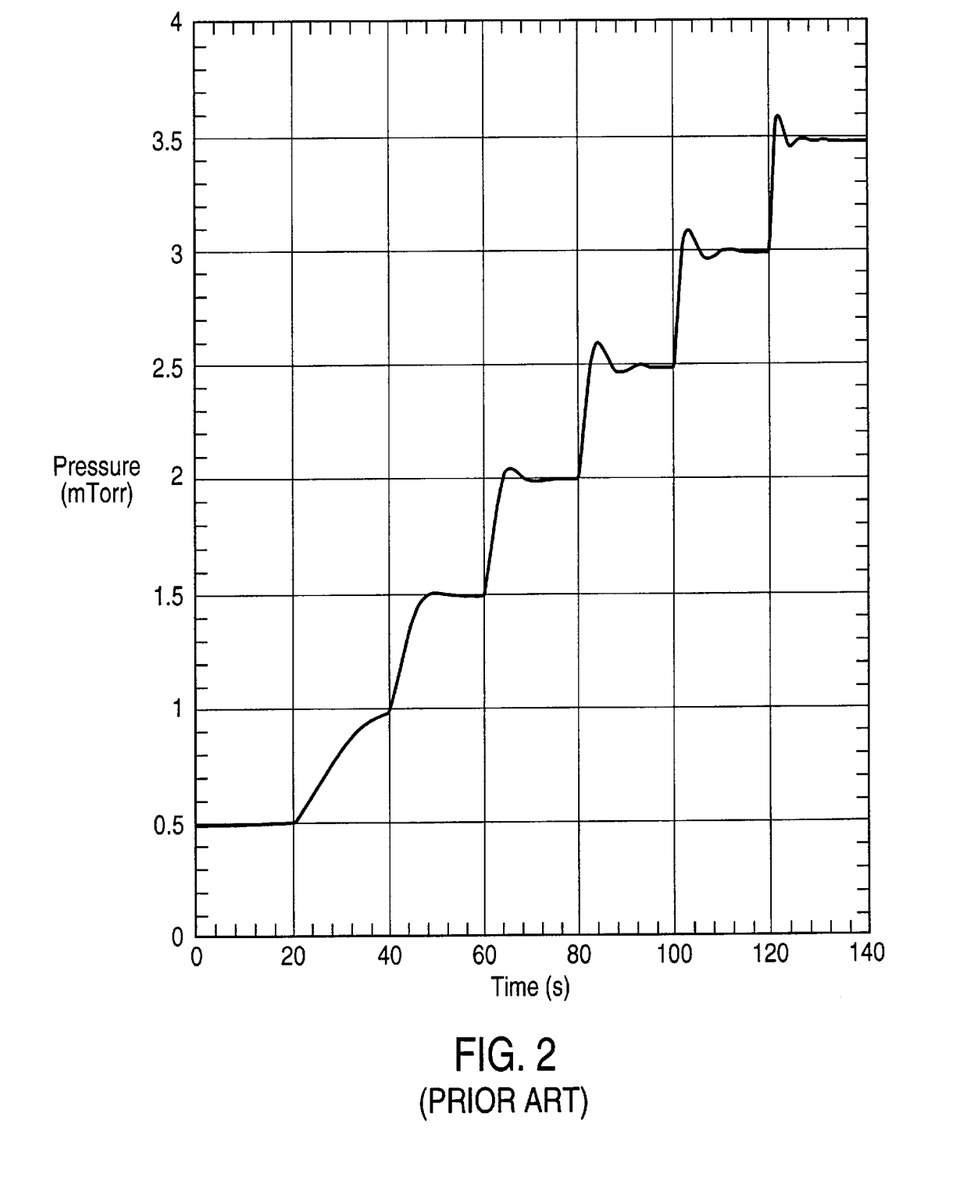

FIG. 1 illustrates a vacuum chamber system in which the present invention can be implemented. Vacuum chamber 112 is a sealed chamber with a number of gas inlets and outlets. Gas is provided to the chamber through a gas metering device, such as mass flow controller 110 which measures the gasinflow to the chamber. The vacuum chamber may have several gas metering devices to provide different gases to the chamber. The pressure in the chamber is monitored by pressure sensor 122. The pressure is controlled by adjusting exhaust throttle valve 118 which is coupled to vacuum pump 120. Vacuum pump 120 draws gas out of vacuum chamber 112 through exhaust throttle valve 118. Valve actuator motor 116 adjusts the position of throttle valve 118. Valve actuator motor 116 is in turn controlled by valve controller 114.

In operation, gases are supplied to chamber 112 through the gas inlet metering devices, vacuum pump 120 is activated, and throttle valve 118 is adjusted to achieve a desired pressure level in chamber 112. If the chamber pressure level is low, throttle valve 118 is further closed to reduce the rate that vacuum pump 120 removes gas from chamber 112. If the chamber pressure level is high, throttle valve 118 is further opened to let more gas escape from chamber 112, thereby reducing the pressure inside chamber 112.

The present invention provides a system for controlling the pressure in a chamber in a fast efficient manner which also allows for rapid changes to the process recipe. The method is described as applied to the pressure control system of FIG. 1. The relationship between the exhaust gas outflow through valve 118, the pressure, and the position of valve 118 is highly non-linear. Conventional control system techniques generally provide poor performance with non-linear systems. The present invention provides a high performance system for controlling pressure in a chamber by effectively linearizing the control component of the non-linear system. The first step is to characterize the valve to establish a static relationship between exhaust flow, valve position and chamber pressure. The relationship between exhaust flow and valve position depends upon the shape of the valve opening and the nature of the valve drive linkage. The linkage and valve shape may be defined such that the change in the size of the opening in the chamber initially increases slowly then speeds up and finally slows down when the valve approaches the fully closed position. One way to characterize the valve is to set mass flow controller 110 to a nominal flow value, then move throttle valve 118 in small increments from fully closed to fully open. At each increment, stop the valve movement long enough to allow time for the pressure to settle to a steady state, and record the pressure. Then repeat the process for a number of different mass flow controller 110 flow values. This provides a table which defines relationships between valve position, mass flow controller 110 flow and the chamber pressure. Alternatively, valve characterization data is generally available from valve manufacturers. In systems where other parameters influence this relationship, these other parameters should also be included in the characterization process. In the pressure control system of FIG. 1 the mass flow controller 110 flow value, and the position of throttle valve 118 are the primary parameters that determine the chamber pressure. Other parameters, such as gas type, have little effect on the pressure relationships. Therefore, in this embodiment of the present invention, based on the static relationships defined in the characterization process, the desired valve position can be calculated for a given pressure and flow.

In one embodiment, the current pressure measurement and a desired exhaust flow value are used to calculate a position of the valve to achieve a desired result. Based on the characterization data the valve position is adjusted to define the exhaust flow. If the selected exhaust flow happens to exactly match the unknown inlet flow then the pressure stabilizes at or about its current value. If the selected exhaust flow differs from the inlet flow, then the pressure steadily rises or falls, depending on whether the selected exhaust flow is greater than or less than the inlet flow. This type of relationship is called an "integrator behavior." Thus, the above process converts the non-linear relationship between the valve position and the pressure, to an integrating process between the selected exhaust flow and pressure, which is called a linear dynamic integral process.

There are a number of established linear control methods for linear dynamic integral processes which can be effectively mechanized to automatically adjust first the desired exhaust flow, and then calculate the corresponding valve position given the current pressure measurement. One such method is a proportional-integral controller. A proportional-integral controller consists of a comparator which calculates the error, i.e., the difference between the desired pressure setpoint and the current pressure. If the error is positive, i.e., the pressure setpoint is greater than the current pressure, the controller calculates a desired exhaust flow equal to an amount proportional to the error, which is referred to as the proportional term. The controller also increments the desired exhaust flow by an amount proportional to the error at each calculation cycle, which is referred to as the integral term.

This process continues until the pressure error is reduced to zero. This method can be expressed in equation form as:

Desired flow value=proportional_gain*pressure_error +integral_gain*INTEGRAL(error). (1)

To implement the method in a digital computer the mathematical operator INTEGRAL is replaced with SUMMATION(error*delta_T), where delta_T is the time interval between the cycles. The pressure control approach defined by equation (1) generates a pressure response to pressure setpoint changes and inlet flow changes that depends on the combination of the chosen values of the proportional_gain and integral_gain terms.

To further enhance the performance of the pressure control system a further embodiment of the present invention uses a method in which the pressure control response to pressure setpoint changes depends only on the proportional_gain term, and not on the integral_gain term, while the pressure response to changes in inlet flow depends on both the proportional_gain term and the integral_gain controller coefficients. This is illustrated in one embodiment by equation (11) below, and a more detailed derivation of this relationship is provided therein.

The desired flow value for this method can be described in equation form as:

Desired flow value=proportional_gain*pressure_error+(proportional_gain*integral_gain*INTEGRAL(pressure_error))+integral_gain*VOLUME*pressure. (2)

The VOLUME term is a coefficient corresponding to the effective volume of the chamber which relates changes in gas inflow to the chamber pressure. The effective volume of the chamber comprises the volume of the chamber plus the additional effect on the volume of the chamber components including inlets, outlets, measurement devices, valves and the pumps. With the effective volume accurately determined, the pressure response is independent from the integral_gain coefficient. To implement equation (2) in a digital computer the INTEGRAL operator is replaced with a SUMMATION (pressure_error*delta_T) operation, where delta_T is the time interval between the cycles. Two important features of equation (2) are the arrangement of the controller coefficients, so that the proportional_gain term only determines the pressure setpoint changes, and secondly the additional feedback term "integral_gain*VOLUME*pressure," which is a function of the absolute chamber pressure, and is not a function of the pressure_error term.

Figure 3:
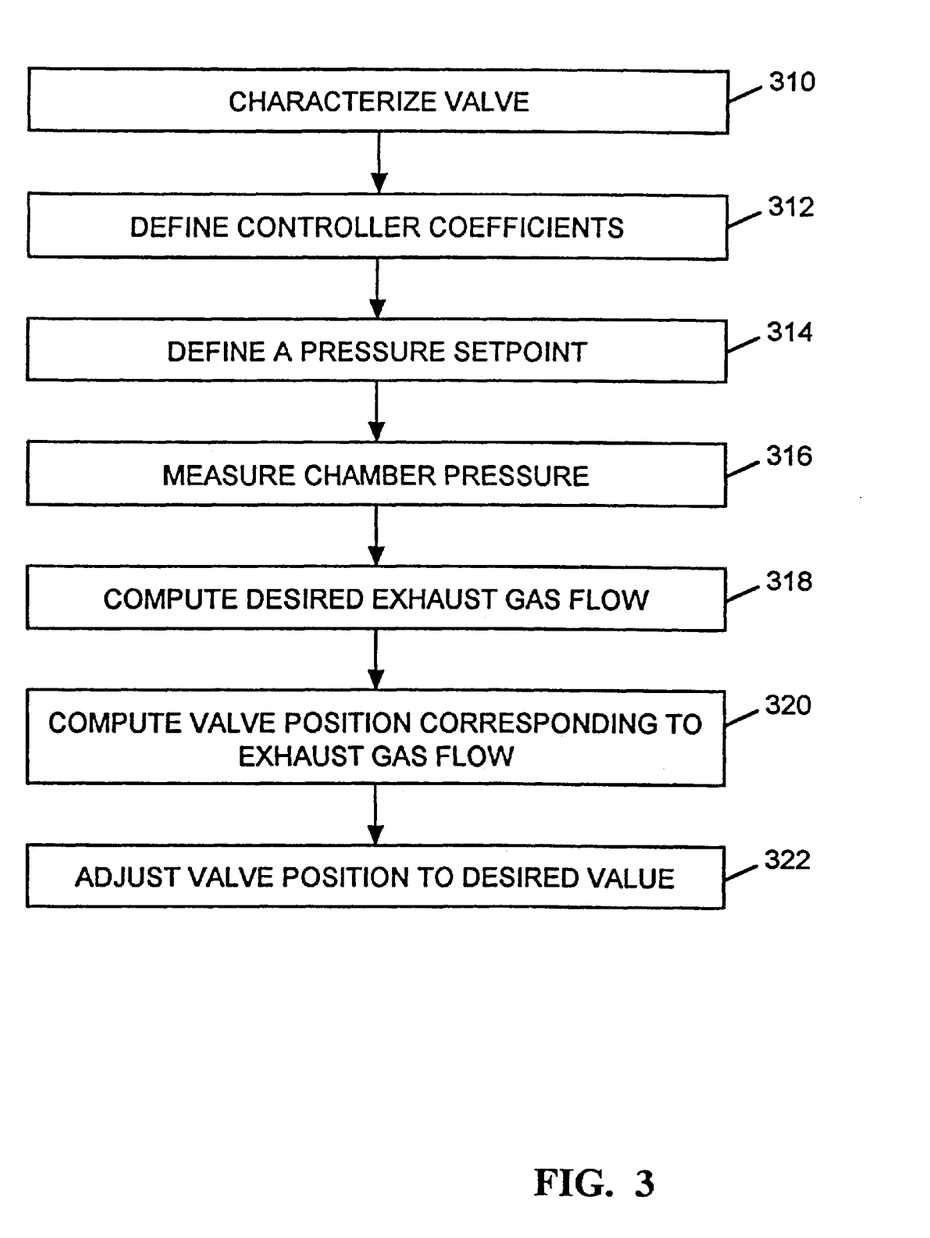

FIG. 3 illustrates a flow chart of the above described method for controlling pressure according to one embodiment of the present invention. First in step 310 the valve is characterized to define the conductance curve of the valve which is the static relationship between the exhaust flow, the valve position, and the chamber pressure. There are many ways to characterize a valve. One method is to fix the inlet flow to a desired flow value, position the valve in a number of sufficiently small steps covering the valve's range from completely open to completely closed, and record the corresponding chamber pressure measurements. This data can then be compiled into a table of the ratio of gas outflow to pressure for each valve position. This characterization process need only be performed once for a given set of system components, for example, for a given set of components illustrated in FIG. 1. Next in step 312 the controller coefficients proportional_gain and integral_gain are defined so as to optimize the pressure response for the particular application. The controller coefficients can be defined by a number of methods including computation, simulation or empirically, so as to provide a desired chamber pressure response when either the desired pressure setpoint or the inlet flow is changed. In step 314 the pressure setpoint is defined. In step 316 the chamber pressure is measured which starts the iterative process of adjusting the chamber pressure to the desired pressure. In step 318 the desired exhaust flow value is computed using equation (2) above. In step 320 the valve position corresponding to the desired exhaust flow value is determined using the valve relationships defined in the characterization step 310. Finally in step 322 the valve position is adjusted to the desired value to provide the desired exhaust flow.

Figure 4:
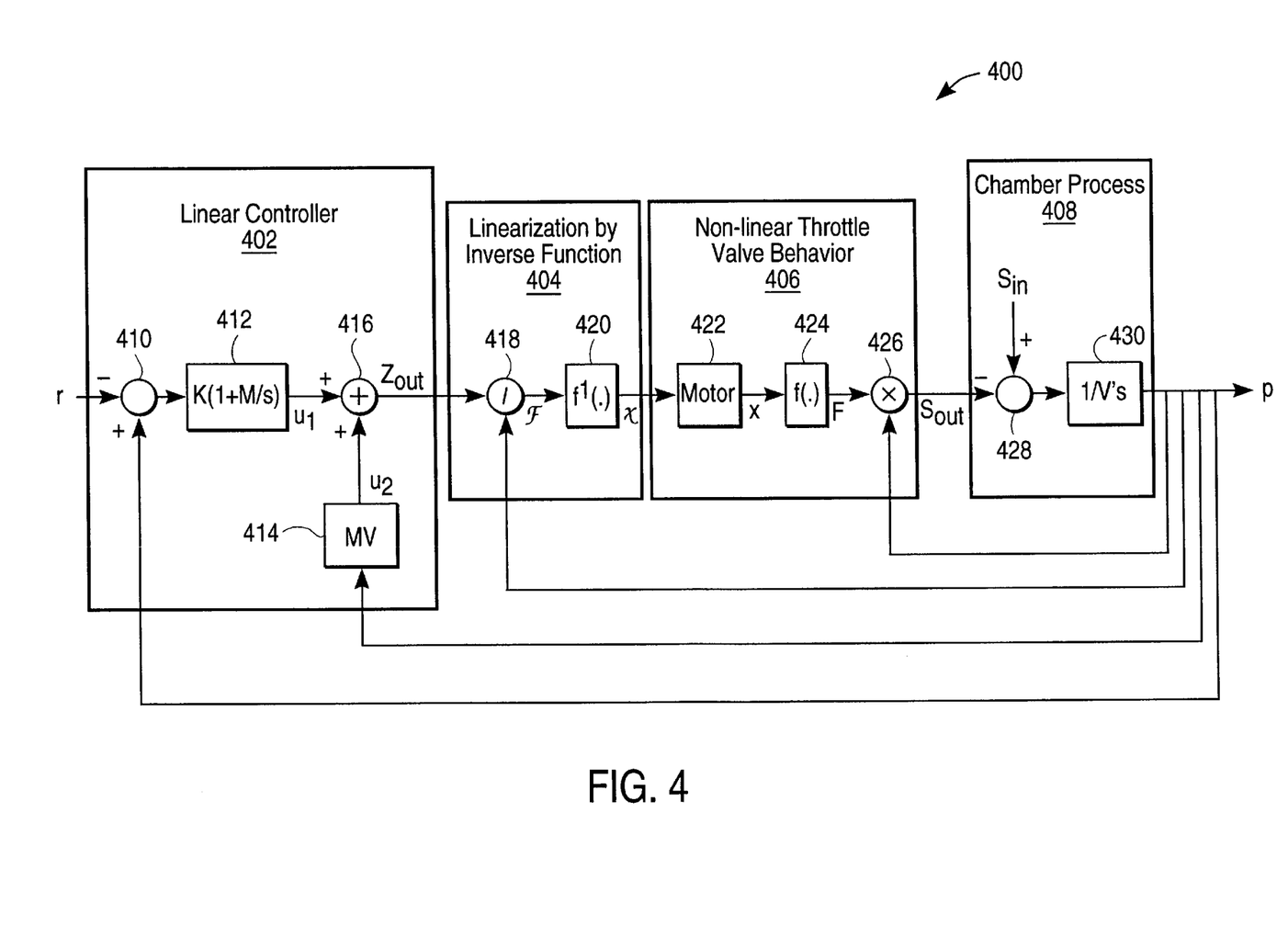

A pressure control system according to one embodiment of the present invention is now described in greater detail and is illustrated in the FIG. 4 block diagram control system model. The control system modeled in FIG. 4 is described in the context of controlling a pressure chamber as illustrated in FIG. 1. The pressure in chamber 112 depends upon the difference between the incoming gas flow through mass flow controller 110 and the outgoing gas flow through valve 118. The outgoing gas flow is in turn a non-linear function of the pressure inside chamber 112 and the position of valve 118. It is this non-linear relationship which creates problems for conventional linear control systems. The change in pressure over time in the chamber can be described as:

$$V \frac{dp}{dt} = (S_{in} - S_{out}) \quad (3)$$

where V is a constant representing the effective volume of the chamber, p is the pressure, $S_{in}$ is the total inlet gas inflow into the chamber through mass flow controller 110, and $S_{out}$ is the total exhaust flow past throttle valve 118. The chamber pressure p is measured by pressure sensor 122. The gas inflow $S_{in}$ is often selected by an equipment operator, however, the value of $S_{in}$ is generally not made available to the pressure control system. The gas outflow $S_{out}$ is not measured and is not known, but the gas outflow can be affected by changing the throttle valve 118 position.

The ratio of the gas outflow rate to pressure is called the conductance curve of a valve and is a function of the position of the valve. In equation form this can be written as F=f(x) where F is the conductance curve and x is the valve position. The conductance curve is a valve characteristic and is therefore fixed for a given valve. The conductance curve for a valve can be measured or generally it can be obtained from the valve manufacturer.

The conductance curve is also a weak function of the gas type and the gas outflow rate, which means the ratio of the gas outflow rate to pressure as a function of the valve position is slightly different at different gas outflow rates, and may also vary with different gas types. In one embodiment, neither the gas type nor the gas outflow rate are measured, therefore the effects of these variables on the conductance curve are ignored. In operation the control system compensates for these variations through the feedback system.

In one embodiment the position of the valve is controlled indirectly by controlling valve actuator motor 116. Alternatively, a sensor can be added to the valve to sense the valve position directly. References herein to valve position may refer to either valve position directly or an indirect indication of the valve position based on the actuator motor. Many different types of linkages are available to link actuator motor 116 and valve 118. Many of these linkages are also non-linear to provide more rapid adjustment of valve 118 at some section of its range, or to provide greater movement resolution in another section of the valve's operating range. The valve linkage characterization is typically available from the valve manufacturer. Alternatively, the valve linkage can be empirically characterized.

The relationship between the gas flows and pressure in a chamber are described by the following equation:

$$V\frac{dp}{dt} = (S_{in} - F*p) \quad (4)$$

where F is the conductance curve. To control the pressure in the chamber, one embodiment of the present invention first linearizes the process and then applies a robust feedback control method to the linearized process. In equation (4) the pressure is the measured quantity, and the manipulatable variable is the valve position x which determines the sample point of a given conductance curve F.

To linearize the control system the present invention first introduces two new variables $\mathcal{F}$ and $Z_{out}$. These variables are defined such that:

$$x = f^{-1}(\mathcal{F}) \quad (4.1)$$

$$\mathcal{F} = \frac{Z_{out}}{p} \quad (4.2)$$

where $f^{-1}(\ )$ is the inverse function of $f(\ )$, and $Z_{out}$ is the desired exhaust gas flow which under ideal conditions is equal to the actual exhaust flow, $S_{out}$. $Z_{out}$ is a computational number, it is not a measure of an actual physical value. There are two important components of these new variable definitions, one is the introduction of the inverse transform, the second is dividing $Z_{out}$ by the pressure p. The inverse function can be implemented using a table, which is the inverse conductance relationship. The inverse conductance table can then be used to provide a valve position corresponding to a conductance value input. The inverse conductance table can be implemented as a lookup table in a computer system. As is known by those of ordinary skill in the art, interpolation techniques can be used to provide valve position values for conductance value inputs between the values stored in the table. Substituting these new variables into the process model of equation (4), we can manipulate the process equation as follows:

$$V\frac{dp}{dt} = S_{in} - f(f^{-1}(\mathcal{F}))p \quad (5)$$

$$V\frac{dp}{dt} = S_{in} - f\left(f^{-1}\left(\frac{Z_{out}}{p}\right)\right)p \quad (6)$$

$$V\frac{dp}{dt} = S_{in} - \left(\frac{Z_{out}}{p}\right)p \quad (7)$$

$$V\frac{dp}{dt} = S_{in} - Z_{out} \quad (8)$$

Equation (6) is obtained by substituting $\mathcal{F}=Z_{out}/p$. Since $f^{-1}$ is the inverse function of f, $f(f^{-1}(Z_{out}/p))$ is its argument $Z_{out}/p$ which yields Equation (7). The p factor then cancels to yield equation (8). Equation (8) represents the system using the new control variable, $Z_{out}$. Under these ideal conditions, the process to be controlled is reduced to the control of an integrator with a disturbance input, $S_{in}$, and a control input $Z_{out}$ as described by equation (8). Thus the present invention transforms a non-linear dynamic system which is complicated by the highly non-linear conductance curve and the multiplicative pressure factor term, into a simple linear dynamic system by introducing an inverse transform and a new control variable, $Z_{out}$. Using this linear model of the chamber pressure system, a linear control method to control the chamber pressure is now provided.

One method for controlling the linearized system is illustrated in the FIG. 4 control system 400. Control system 400 includes a linear controller block 402 and a linearization by inverse function block 404. Both of these functions are performed by valve controller 114, illustrated in FIG. 1. The output of the linearization by inverse function block 404 is provided to the non-linear throttle valve block 406. Valve block 406 describes the operation of valve actuator motor 116 and exhaust throttle valve 118, illustrated in FIG. 1. The output of valve block 406 is coupled to the chamber process block 408. Chamber process block 408 corresponds to vacuum chamber 112, illustrated in FIG. 1.

In operation, a pressure setpoint value r and a measured value of the chamber pressure p are provided as inputs to the summation node 410 in linear controller block 402 of the valve controller 114. The output of summation node 410 is provided to the proportional-integral controller 412. Proportional-integral controller 412 provides a K(1+M/s) term wherein K and M are tuning constants of the system, and s is the Laplace operator. The tuning constants K and M correspond to the controller coefficients proportional ain and integral_gain described above. In one embodiment K modifies the motor control of the valve. For example, K may affect the speed of the motor, or the pattern of the motor control signal. The pattern of the control signal determines the rate of change of the motor. For example, to move the motor a given amount the control signal may initially move the motor at a high speed and then as the motor nears the destination position the control signal may reduce the speed of the motor. The larger the value of K the faster the control system response. Too large of a value of K may cause undesirable effects such as a control response with overshoot. The tuning constant M is an abstract value that determines how well the system rejects perturbations to the incoming gas flow.

Other types of controllers suitable to control a pure integrating process can be used in place of the proportional-integral controller. A computer software implementation of the proportional-integral controller should take into account that a computer only produces output values at discrete time intervals. Methods to implement such sampled-data control systems are well known by those of ordinary skill in the art. The output of proportional-integral controller 412 is a partial command value, $u_1$. The measured chamber pressure is multiplied by the tuning constant M and volume V at block 414. The product is labeled $u_2$. The $u_1$ and $u_2$ values are added together at node 416 to generate $Z_{out}$. In equation form the output of linear controller 402 is:

$$Z_{out} = K\left(1 + \frac{M}{s}\right)(p-r) + MVp \quad (9)$$

where r is the pressure setpoint. $Z_{out}$ is defined so as to shadow the actual gas outflow, $S_{out}$. $Z_{out}$ thereby effectively provides computational access to the actual gas outflow which is otherwise unknown and is veiled by the non-linear conductance curve. Converting equation (9) into the time domain yields the following linear function of p and r:

$$Z_{out}(t)=K(p(t)+M\int_0^t p(t)dt)+MVp(t)-K(r(t)+M\int_0^t r(t)dt) \quad (9.1)$$

Alternatively, if p(t)-r(t) is renamed e(t), the error as a function of time, then equation (9.1) becomes a linear function of pressure, p, and the error, e:

$$Z_{out}(t) = K(e(t) + M\int_0^t e(t) + MVp(t)) \quad (9.2)$$

Therefore, the error is integrated until it becomes zero. The valve position can then be computed as a function of time using the equation $$x(t) = f^{-1}\left(\frac{Z_{out}(t)}{p}\right) \quad (9.3)$$

where $f^{-1}()$ is the inverse conductance curve function.

Linear controller 402 differs from a conventional proportional-integral controller in that linear controller 402 includes a direct pressure feedback term, namely, the MVp term.

The MVp feedback term significantly improves the performance and tunability of the feedback control system.

Using this control method, the system can be represented in the s-domain as:

$$Vsp = S_{in} - K\left(1 + \frac{M}{s}\right)(p - r) - MVp \quad (10)$$

which can be re-arranged as:

$$p = \left(\frac{s}{\left(s + \frac{K}{V}\right)(s + M)}\right)\left(\frac{S_{in}}{V}\right) + \left(\frac{\frac{K}{V}}{s + \frac{K}{V}}\right)r \quad (11)$$

The Laplace transform form of the last equation, indicates the response of p, the pressure, to a change in r, the setpoint, is an exponential function with a time constant (K/V), and does not depend on M. To ensure the independence of the pressure response to a change in the pressure setpoint the effective chamber volume V should be carefully determined. Having the pressure control response to a change in the pressure setpoint depend only on one parameter simplifies the optimization process because only one tuning parameter needs to be defined rather than two. Applying the control system of the present invention thereby causes pressure in the chamber to converge to the desired setpoint, r, exponentially, and the speed of convergence can be simply adjusted by adjusting the tuning parameter K. This is a particularly desirable feature for process control applications, and allows for independent adjustments of K and M.

The $Z_{out}$ output of linear controller 402 is provided to the linearization by inverse function block 404. $Z_{out}$ is divided by the measured chamber pressure at division node 418, to provide the control variable $\Im$ to inverse function block 420. The output of inverse function block 420 is the desired valve position x. The desired valve position x (which changes smoothly over time in response to a change in the pressure setpoint or inlet gas flow) is provided as an input to the non-linear throttle valve block 406.

The non-linear throttle valve block 406 and chamber process block 408 represent the actual physical processes. Motor 422 adjusts the valve position. The change in valve position causes a change in the gas outflow as described by the conductance curve block 424 multiplied by the pressure. The pressure in the chamber is then:

$$p = \frac{S_{in} - S_{out}}{V's} \quad (12)$$

as represented by node 428 and block 430, where V' is the actual chamber volume including the effect of the components coupled to the chamber.

The present invention thereby uses a new control variable $Z_{out}$ and an inverse function to linearize a pressure chamber system and controls the system such that: (1) For a step change in the pressure setpoint, r, the pressure responds as an exponential function with a time constant of KN, expressed as $$p = \frac{\frac{K}{V}}{s + \frac{K}{V}} * \frac{r^\circ}{s} \quad (13)$$

in Laplace domain, and equivalently as $$p = \left(1 - e^{-\frac{K}{V}t}\right)r^\circ \quad (14)$$

in the time domain, where r° is the magnitude of the step; (2) For a step change in $S_{in}$, the pressure responds as $$p = \frac{s}{V*\left(s + \frac{K}{V}\right)(s + M)} * \frac{S^\circ_{in}}{s} \quad (15)$$

in Laplace domain, and equivalently as $$p = \frac{1}{V} * \frac{1}{\left(M - \frac{K}{V}\right)} * \left(e^{-\frac{K}{V}t} - e^{-Mt}\right) \quad (16)$$

in the time domain, where $S^\circ_{in}$ is the magnitude of the step.

Figure 5:
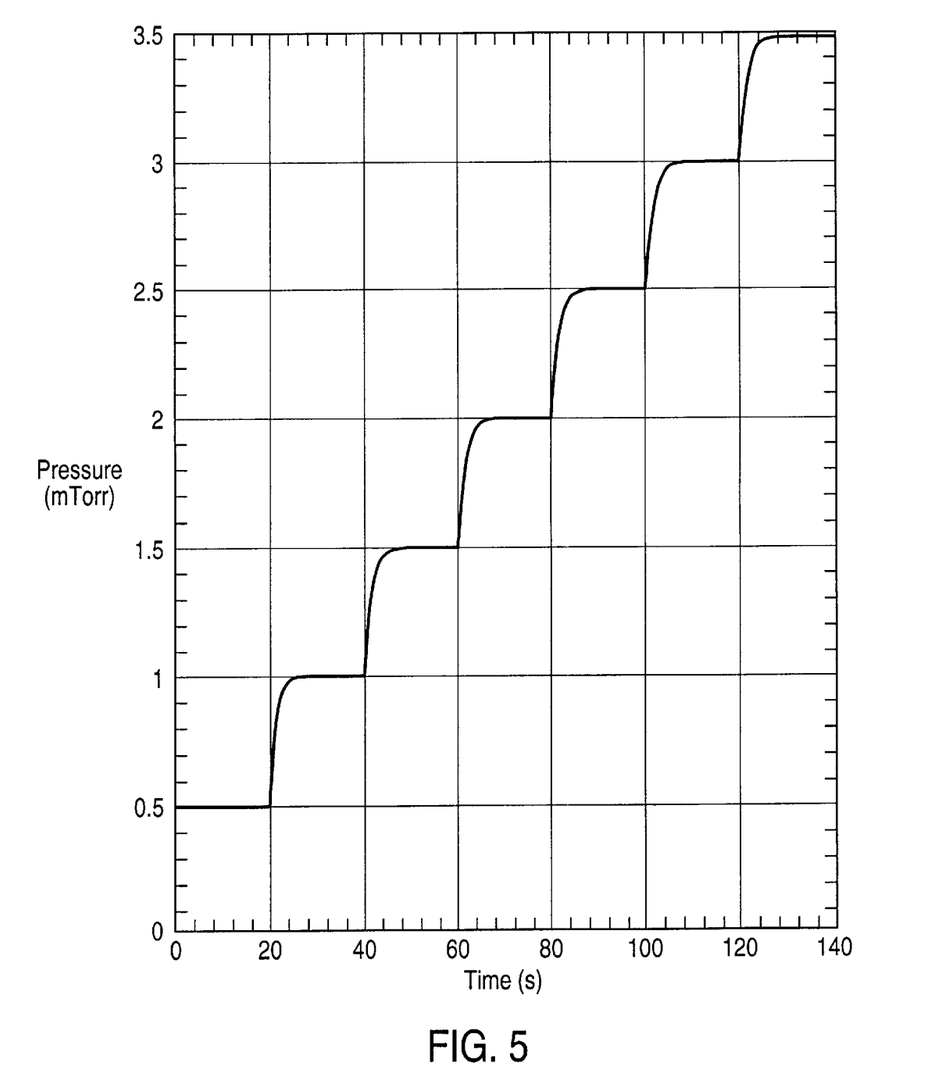

FIG. 5 illustrates the pressure response over a range of different pressure setpoints of a pressure control system according to one embodiment of the present invention. FIG. 5 illustrates several highly desirable features of the present invention pressure control system including the uniformity of the pressure response over a range of pressures, the rapid response of the system to pressure setpoint changes, and the avoidance of overshoot and ringing. In the example of FIG. 5, the system adjusts the pressure 0.5 mTorr in less than 8 seconds. The definition of the K controller coefficient determines the pressure control system response speed to changes in pressure setpoint. Changes in the gas inflow, $S_{in}$, also affect the pressure. The affect of changes in the gas inflow on pressure is described by the $S_{in}$ coefficient from equation (11) above. After K has been selected to provide the desired response to pressure setpoint changes, the controller coefficient M can be defined to minimize the affect of changes in the gas inflow on the pressure. Because the system response to pressure setpoint changes is independent of M, M can be modified without affecting the selection of K to optimize the response to pressure setpoint changes. Furthermore, the pressure control system of the present invention can be used over a wide range of pressures including low pressure vacuum systems and high pressure systems. The present invention's rapid response to pressure setpoint changes increases the throughput of such manufacturing equipment as semiconductor etch chambers. The

What is claimed is:

1. A method of controlling pressure in a chamber, the chamber having an exhaust valve having an associated position, the method comprising the steps of:
   (a) defining a pressure setpoint;
   (b) measuring the pressure in the chamber;
   (c) computing, as a linear function of the measured pressure and the pressure setpoint, a control variable representing a desired exhaust gas flow from the chamber;
   (d) computing, as a function of the control variable and the measured pressure, a desired valve position using an inverse conductance curve function;
   (e) adjusting the position of the exhaust valve based on the desired valve position so as to establish a chamber pressure associated with the pressure setpoint.

2. The method of claim 1, wherein
   the control variable computed in step (c) smoothly varies over time from a starting control value to an end control value;
   the desired valve position computed in step (d) smoothly varies over time from a starting position to an end position in conjunction with changes in the value of the control variable.

3. The method of claim 1, wherein the function for computing the control variable includes a direct pressure feedback term MVp, wherein M is a tuning parameter, V represents an effective chamber volume for the chamber, and p is the measured pressure.

4. The method of claim 1 wherein the desired exhaust gas flow is equal to (proportional_gain*pressure_error)+(proportional_gain*integral_gain*INTEGRAL)(pressure_error))+integral_gain*VOLUME*pressure.

5. The method of claim 4 wherein the inverse conductance curve function describes the relationship between valve position and exhaust gas flow and pressure.

6. The method of claim 5 wherein the desired valve position is computed using a lookup table.

7. The method of claim 6 further comprising the step of characterizing the valve to define a static relationship between exhaust gas flow, valve position and chamber pressure over a range of valve positions.

8. The method of claim 6 further comprising the step of characterizing the pressure response over a range of K and M values to define K and M for optimum performance.

9. The method of claim 1 wherein $Z_{out}=K(1+(M/s))(p-r)+MVp$, where $Z_{out}$ is the control variable representing the desired exhaust gas flow, K and M are tuning parameters, s is the Laplacian operator, p is the measured pressure, r is the pressure setpoint, and V represents an effective chamber volume for the chamber.

10. The method of claim 7 wherein the measured pressure responds to a change in the pressure setpoint over time in a manner that depends on the value of K, and is independent of the value of M.

11. The method of claim 10 wherein a change in inlet gas flow into the chamber causes a change in pressure in the chamber over time that depends on the value of K and the value of M.

12. The method of claim 11 wherein said chamber is a semiconductor etch chamber.

13. A method of controlling pressure in a chamber, the chamber having an exhaust valve having an associated position, the method comprising the steps of:
   (a) defining a pressure setpoint;
   (b) measuring the pressure in the chamber;
   (c) computing a desired valve position as a function of (A) a difference between the pressure setpoint and the measured pressure value and (B) a feedback term, MVp, wherein M is a tuning parameter, V represents an effective volume of the chamber, and p is the measured chamber pressure,
   (d) adjusting the position of the exhaust valve based on the desired valve position so as to establish a chamber pressure associated with the pressure setpoint.

14. The method of claim 13 wherein said chamber is a semiconductor etch chamber.

15. A system for controlling the pressure in a chamber comprising:
   an inflow valve in said chamber, said inflow valve for providing gases to said chamber;
   a pressure sensor coupled to said chamber for measuring the pressure in said chamber;
   an exhaust valve, having an associated position, in said chamber;
   a valve actuator coupled to said exhaust valve for adjusting the position of said exhaust valve;
   an exhaust valve controller coupled to said valve actuator, wherein said valve controller computes a control variable representing a desired exhaust gas flow as a linear function of a pressure setpoint and the measured pressure, computes a desired valve position by applying an inverse conductance curve function to the control variable, and adjusts the position of the exhaust valve based on the desired valve position so as to establish a chamber pressure associated with the pressure setpoint.

16. The system of claim 15 wherein said chamber is a semiconductor etch chamber.

17. The system of claim 15, wherein the control variable smoothly varies over time from a starting control value to an end control value;
   the desired valve position smoothly varies over time from a starting position to an end position in conjunction with changes in the value of the control variable.

18. The system of claim 15, wherein the linear function for computing the control variable includes a direct pressure feedback term MVp, wherein M is a tuning parameter, V represents an effective chamber volume for the chamber, and p is the measured pressure.

19. The system of claim 15 wherein the desired exhaust gas flow is equal to (proportional_gain*pressure_error)+(proportional_gain*integral_gain*INTEGRAL)(pressure_error))+integral_gain*VOLUME*pressure.

20. The system of claim 15 wherein $Z_{out}=K(1+(M/s))(p-r)+MVp$, where $Z_{out}$ is the control variable representing the desired exhaust gas flow, K and M are tuning parameters, s is the Laplacian operator, p is the measured pressure, r is the pressure setpoint, and V represents an effective chamber volume for the chamber.

* * * * *